United States Patent [19]

Davis et al.

[11] Patent Number: 5,360,521
[45] Date of Patent: Nov. 1, 1994

[54] METHOD FOR ETCHING SILICON

[75] Inventors: Richard A. Davis, Plano; Mark Plagens, Richardson; Uppili Sridhar, Garland, all of Tex.

[73] Assignee: Honeywell Inc., Minneapolis, Minn.

[21] Appl. No.: 151,334

[22] Filed: Nov. 12, 1993

[51] Int. Cl.$^5$ .............................. C25F 3/12
[52] U.S. Cl. .............................. 204/129.3
[58] Field of Search ...................... 204/129.3

[56] References Cited

U.S. PATENT DOCUMENTS

| | | | |
|---|---|---|---|
| 3,853,650 | 12/1974 | Hartlaub | 204/129.3 X |
| 4,664,762 | 5/1987 | Hirata | 204/129.3 |
| 4,808,549 | 2/1989 | Mikkor et al. | 204/129.3 X |
| 4,874,499 | 10/1989 | Smith et al. | 204/403 |
| 4,996,627 | 2/1991 | Zias et al. | 204/129.3 X |
| 5,167,778 | 12/1992 | Kaneko et al. | 204/129.3 |

Primary Examiner—Donald R. Valentine
Attorney, Agent, or Firm—William D. Lanyi

[57] ABSTRACT

A method is provided for assuring good electrical contact between a power supply and appropriate regions of silicon wafers to assure proper etching during the micromachining of the silicon die locations on the wafer. A plurality of conductors are disposed in the interstices between rows and columns of die locations and each die location that is to be etched is provided with a conductive extension connecting its relevant region with one of the interstice conductors. A preselected number of die locations are dedicated to the purpose of providing conductive pads against which contacts of a power supply can be disposed. The many interconnections between the row interstice conductors and the column interstice conductors assures good electrical distribution across the entire surface of a first side of the wafer.

18 Claims, 6 Drawing Sheets

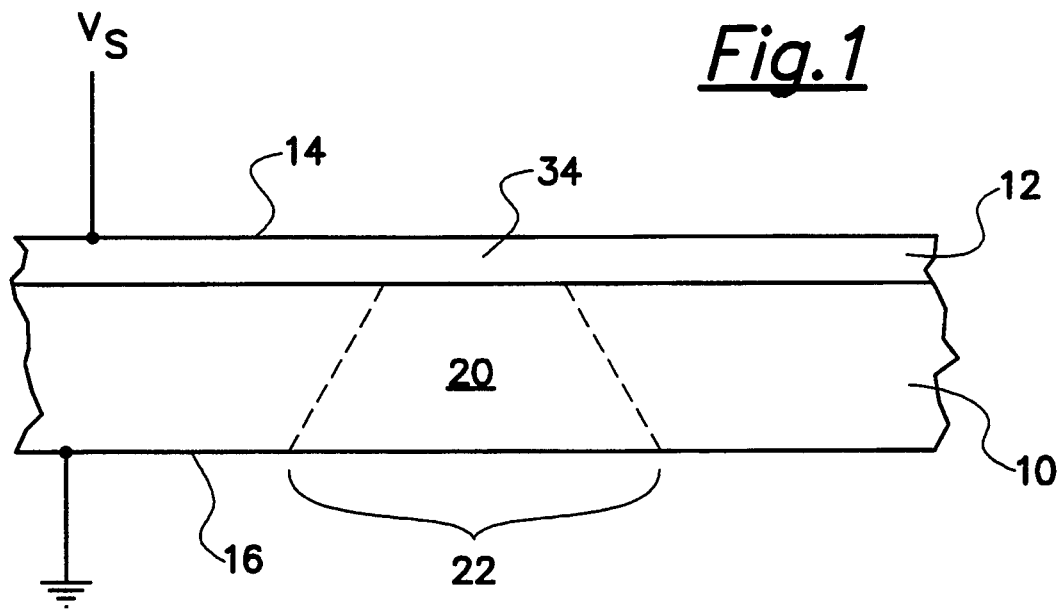
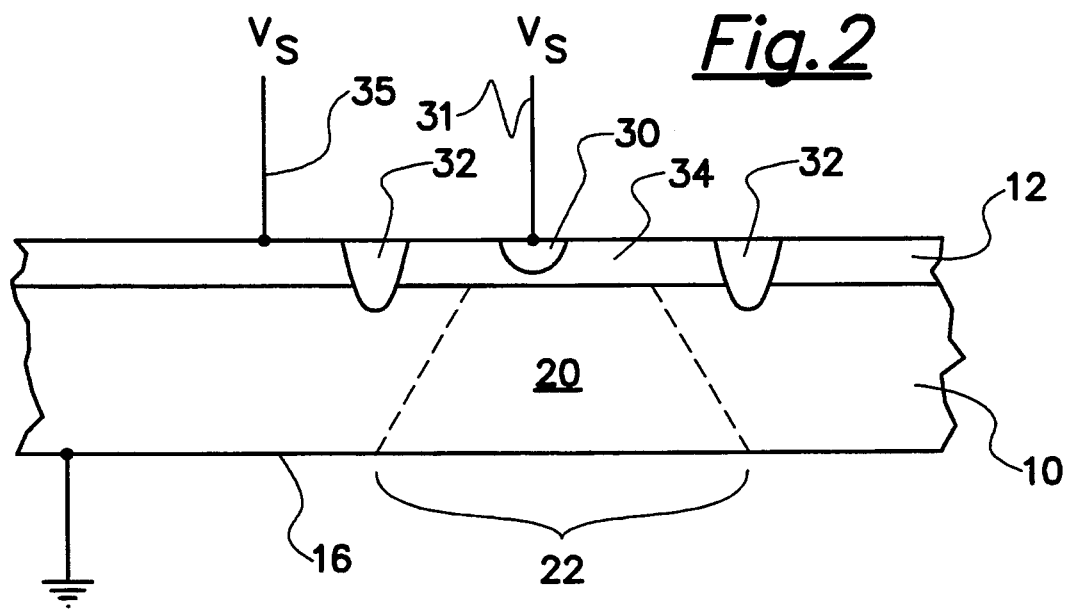

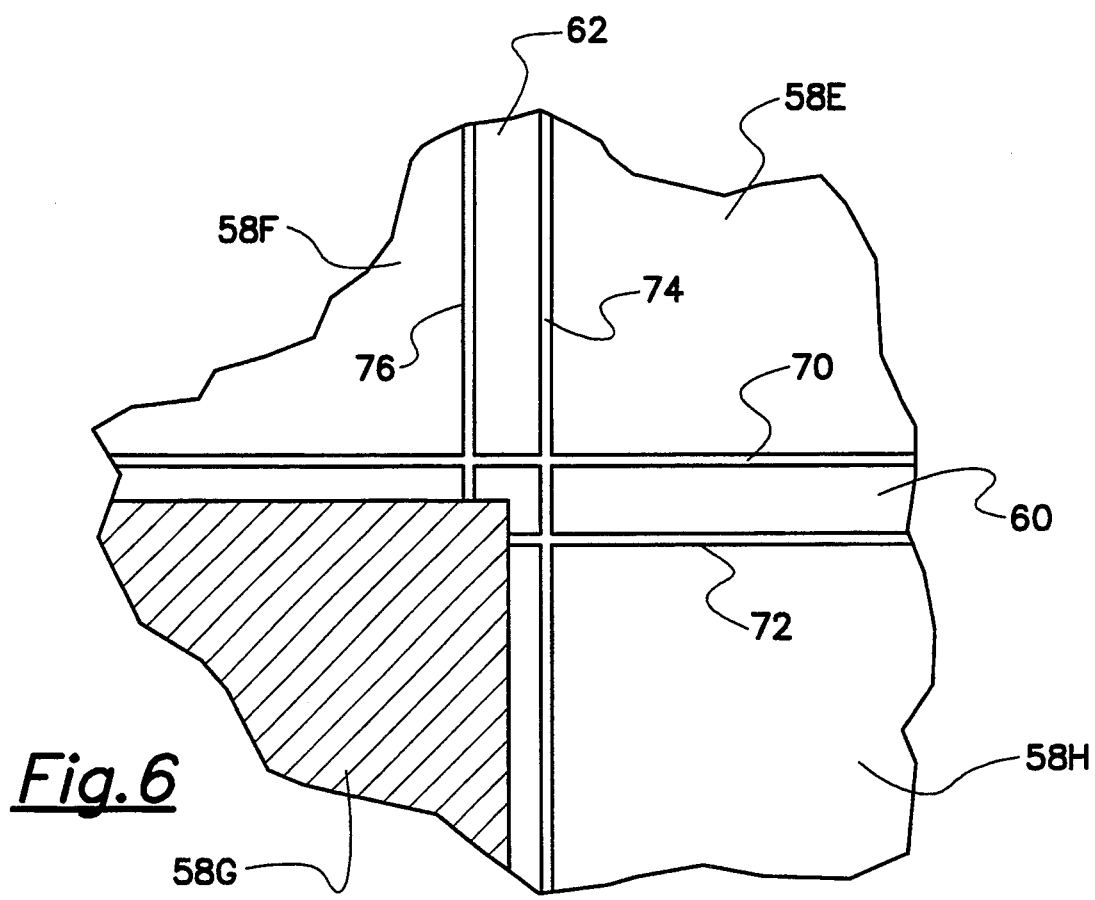
_Fig.6_
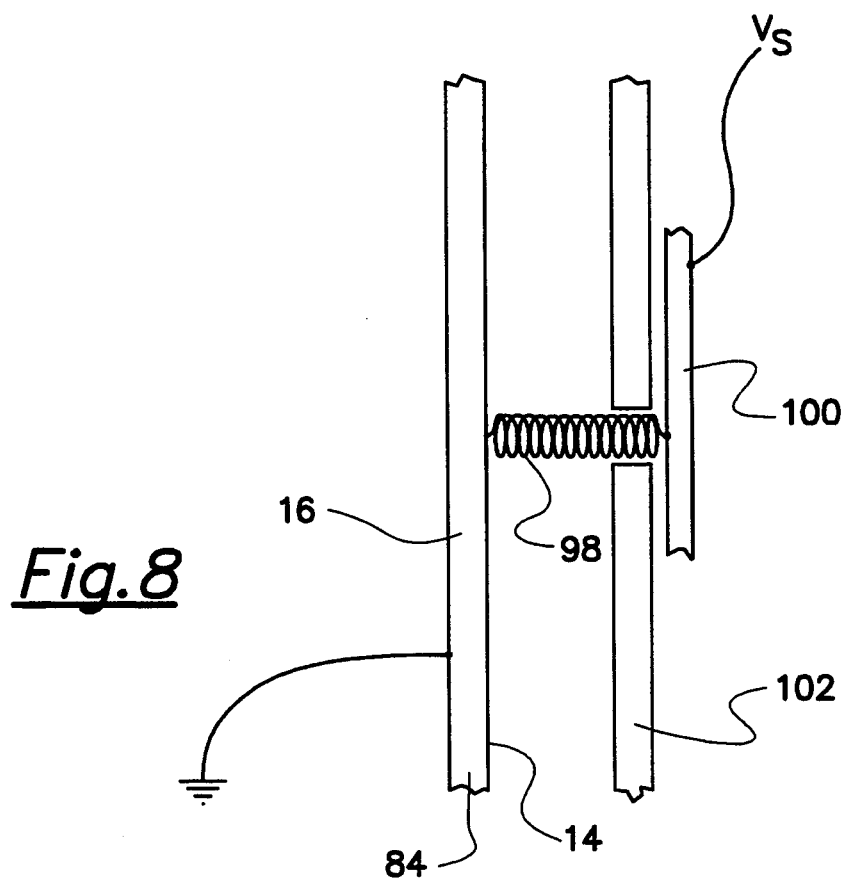
_Fig.8_

METHOD FOR ETCHING SILICON

BACKGROUND OF THE INVENTION

1. Field of the Invention

The present invention relates generally to the process of etching silicon and, more particularly, to providing an accurate etch stopping mechanism for producing pressure sensors and other semiconductor devices. The present invention also relates to products made by this method.

2. Description of the Prior Art

As is well known by those skilled in the art, semiconductor devices are typically manufactured by producing a large plurality of devices on a single silicon wafer and then, after the numerous manufacturing steps have been completed to produce the plurality of silicon dice, each die is separated from the silicon wafer. When the semiconductor devices require etching, it is necessary to assure that the etching procedure stops at the appropriate point when the etchant penetrates a desired depth into the thickness of the silicon wafer. If the thickness of the wafer comprises different materials, particular etchants are selected which selectively etch one material, but not the other. A particular problem occurs when the wafer comprises only a singular material such as silicon. When this occurs, it is typical to etch for a predetermined time or to take advantage of the different dopant characteristics of the material. For example, if the substrate portion of the wafer comprises P type silicon and a first surface of the wafer comprises an N type epitaxial layer, the differently doped regions are used to provide a diode effect because of the PN junction at the interface where the substrate and the epitaxial layer meet. By connecting the epitaxial layer to a power supply and connecting the solution to ground and maintaining the epitaxial layer at a voltage potential sufficiently above that of the substrate, an etchant such as potassium hydroxide can be used to etch a preselected shape into the substrate. When the etchant penetrates sufficiently through the substrate of the wafer and reaches the N type epitaxial layer, the anode of the diode is removed by the etchant and the voltage potential between the epitaxial layer and the etchant decreases appreciably. The current flow between the epitaxial layer and the opposite side of the wafer can be monitored and, as the anodization begins, the current begins to rise. As the etching process is terminated, the current decreases to a lower level. The anodic oxide which is formed prevents further etching from occurring.

The etching process described above is subject to several problems that can adversely affect the quality of the etching procedure. To describe these problems, a back-side etching process will be described wherein a silicon wafer with a first side and a second side is processed to provide numerous semiconductive components on the surface of the first side with an etched recess formed on the second side. According to this type of procedure, a voltage potential is connected in electrical communication with the epitaxial layer of the first side and an etchant, such as potassium hydroxide, is disposed in fluid communication with selected regions of the second side.

One type of failure mechanism in a process such as that described above is when the etchant does not stop etching when it penetrates completely through the substrate and into the epitaxial layer. Under these circumstances, a silicon dioxide layer does not form at the etching surface because the epitaxial layer is debiased and the voltage at the first side of the wafer is not uniform across the entire surface of the wafer. For example, if the electrical contacts at the first side of the wafer do not make good electrical contact with the surface of the epitaxial layer, the appropriate voltage potential between the first and second sides of the wafer is not provided.

Another failure mechanism occurs when the etching stops prematurely and does not penetrate completely through the substrate to reach the epitaxial layer. This type of failure mechanism can be caused by several factors. If the epitaxial layer is electrically shorted in some way to the substrate, then the diode does not function as intended. A second cause of this type of premature etch stopping is the electrical contact between the voltage source and a P+ type diffusion area which is typically present in the surface of the first side of the silicon wafer. If the voltage source contacts a P+ diffusion, there exists an SCR structure between the power supply and the etchant. That SCR structure comprises the P+ type diffusion, the N type epitaxial layer, the P type substrate and the N type etching solution such as potassium hydroxide. This SCR is turned on spontaneously when the P substrate is sufficiently thinned by the etchant so that the P substrate is electrically connected to the bias power supply. This stops any further etching of the P substrate.

Another severe problem can occur when certain particular types of devices are manufactured. For example, if each die location of a silicon wafer is intended for use as a pressure sensor that also contains an integrated circuit on the same die, the surface of the first side of the die in the region of the diaphragm area may be surrounded by a P+ isolation type diffusion that is used to isolate the diaphragm region of the surface from the integrated circuit portion of the surface on the first side of the die. Since the etching occurs on the second side of the wafer to create the diaphragm of the pressure transducer, the P+ type isolation diffusion surrounding that area isolates it from most other areas of the silicon wafer surface. In order to etch the back-side, or second side, of the wafer in the manner described above, electrical contact would have to be made between the power supply and the first side of the wafer within the area surrounded by the P+ type diffusion on every die in the wafer. Because of the small size of the diaphragm area of the die, it is very difficult to assure electrical contact between the power supply and the first side of the wafer within the P+ type isolation diffusion that surrounds the area where that voltage potential must be provided in order to assure an appropriate back-side etching procedure without contacting the P+ isolation region. Furthermore, the diaphragm area of the die may require electrical connection to the power supply terminal of the completed integrated circuit product. This connection could allow conduction paths through the circuit components to the substrate, limiting the voltage potential available to the diaphragm area or possibly causing overload of the etching power supply.

It would therefore be significantly beneficial if a means is provided for etching a silicon wafer on a second side and assuring appropriate electrical connection to the first side of the wafer at the proper locations for each die of the wafer structure.

SUMMARY OF THE INVENTION

The present invention provides a method for making a micromachined semiconductor component comprising the steps of providing a wafer of semiconductor material having a first side and a second side and defining a plurality of die locations on the first side of the wafer. The plurality of die locations are arranged in a pattern of rows and columns wherein each row is separated from its adjacent row by a row interstice and each of the columns is separated from its adjacent column by a column interstice.

The method of making a micromachined semiconductor, according to the preferred embodiment of the present invention, then disposes a plurality of conductors on the first surface of the wafer with at least one of a first group of the conductors being disposed in the row interstice and at least one of a second group of the plurality of conductors being disposed in a column interstice. The method also comprises the step of disposing a plurality of conductive extensions on the first surface of the wafer, wherein each of the polarity of conductive extensions is exposed in electrical communication with a preselected one of the conductors placed in the row and column interstices and electrical communication with a region of one of the plurality of die locations. The method of the present invention also comprises the step of connecting one of the plurality of conductors in electrical communication with a voltage potential and disposing an etchant in contact with a preselected location on the second side of the silicon wafer. After these steps are completed, the present invention further comprises the step of physically separating each one of the plurality of die locations from the other die locations. The present invention also includes the apparatus resulting from the procedure described in the method above.

BRIEF DESCRIPTION OF THE DRAWINGS

The present invention will be more fully and completely understood from a reading of the Description of the Preferred Embodiment in conjunction with the drawings, in which:

FIG. 1 shows a cross section of a silicon wafer having a substrate and an epitaxial layer;

FIG. 2 shows a cross section of a silicon wafer with diffusion regions illustrated;

FIG. 6 shows four silicon dice in which one of the dice in FIG. 6 is provided with a conductive coating thereon;

FIG. 8 shows an arrangement by which electrical communication can be provided between a power supply and one of the die locations on the silicon wafer which is completely covered by a conductive material.

DESCRIPTION OF THE PREFERRED EMBODIMENT

Figure 3:
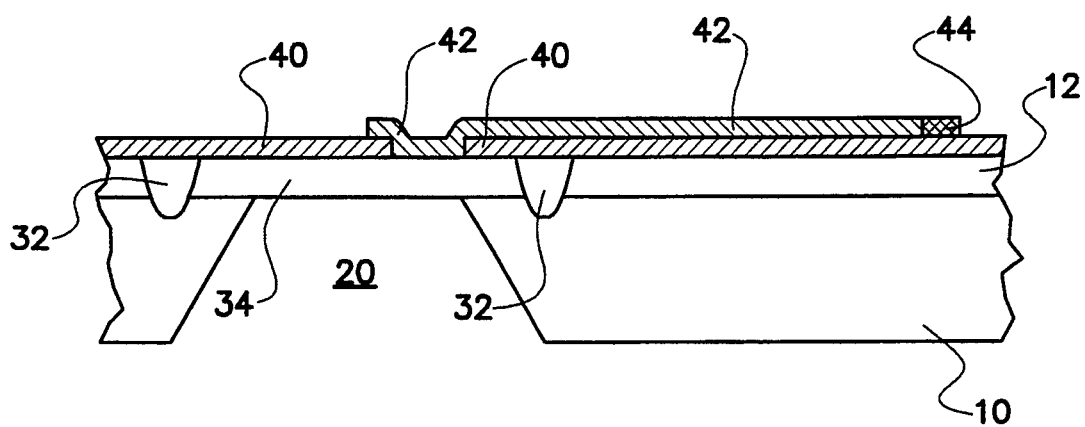
FIG. 3 shows a cross section of a silicon die provided with a conductive extension in accordance with the present invention.

Throughout the Description of the Preferred Embodiment, like components will be identified by like reference numerals.

FIG. 1 shows an exemplary cross section of a semiconductive component which comprises a substrate 10 of silicon material that is doped to result in a P type conductivity material. An N type epitaxial layer 12 is disposed on the substrate 10 to result in a silicon component having a first side 14 and a second side 16 in a manner which is very well known to those skilled in the art. Although the dimensions of the device shown in FIG. 1 can vary widely depending on the application, the substrate 10 can be approximately 0.019 inches thick and the epitaxial layer 12 can be approximately 10.0 micrometers thick. If a recess 20 is to be etched into the back-side of the device, an etchant such as potassium hydroxide is disposed in contact with a preselected region 22 of the surface of the second side 16. This is typically accomplished by disposing a mask on the regions of the surface on the second side 16 which are not intended to be etched and then disposing an etchant in contact with the entire surface of the second side. In certain applications, it is desired to etch the recess 20 into the substrate 10 until the etchant penetrates through the substrate 10 and reaches the epitaxial layer 12. Pressure sensors are typically manufactured in this way, with the epitaxial layer 12 above the recess 20 serving as a diaphragm on which piezoresistive or other pressure sensitive elements are disposed.

FIG. 2 is an illustration of a cross section of a silicon wafer with several diffused portions illustrated for the purpose of describing certain problems that occur during the manufacture of silicon components. Reference numeral 30 identifies a P+ type diffusion in the epitaxial layer 12. If the contact between the power supply and the silicon wafer occurs at the P+ type diffusion 30, the current path between the supply voltage $V_S$ defines an SCR. The silicon controlled rectifier, in effect, is created by the existence of a P+ type diffusion 30, an N type epitaxial layer 12, a P type substrate 10 and an N type etchant in contact with the second side 16 of the wafer. This PNPN relationship creates an SCR which prematurely stops the etching process.

FIG. 2 also illustrates another problem that can occur during the manufacturing process, especially when a P+ isolation diffusion 32 exists around the diaphragm area 34. Even if the power supply is in good electrical contact with the surface of the epitaxial layer 12, as represented by line 35, the path between the contact with the power supply and the diaphragm area 34 approximate the recess 20 may be blocked by an insulation material such as the P+ isolation diffusion 32. When this occurs, the voltage at the diaphragm region 34 is not permitted to rise to its necessary potential because of the isolation diffusion 32. As a result, the etching does not stop and the etchant penetrates completely through the diaphragm region 34.

Several problems have been described above, but it should be realized that many other processing difficulties are related to the manufacture of pressure transducers or other components that require micromachining. The present invention provides a means for solving the problems described above. FIG. 3 shows a cross sectional view of a silicon wafer comprising a substrate 10, an epitaxial layer 12 and a recess 20 formed in the substrate 10. For purposes of illustrating the general structure of a portion of the present invention, the P+ type isolation diffusion 32 is shown surrounding the recess 20 and defining a diaphragm 34 which comprises a portion of the epitaxial layer 12 proximate the recess 20. A silicon dioxide layer 40 is shown on the upper surface of the epitaxial layer 12, but it should be understood that this silicon dioxide layer is not a necessary element of the present invention. In order to provide electrical contact between an external power supply and the diaphragm region 34 of the pressure transducer, a conductive extension 42 is disposed between the diaphragm region 34 and a conductor 44. In a particularly preferred embodiment of the present invention, the conductive extension 42 is made of aluminum and deposited in such a way that it is in electrical communication with a conductor 44 that will be described in greater detail below. The opposite end of the conductive extension 42 is deposited directly in contact with the silicon material of the epitaxial layer 12 and, as a result, forms a Schottky diode contact therebetween. That type of Schottky diode contact between the epitaxial layer 12 and the conductive extension 42 is significantly beneficial following the manufacture of the semiconductor component and during operation. That diode prevents the passage of electrical charges in the direction from the region of the diaphragm to external components of the silicon die during wafer testing or following the dicing operation. Similarly, a Schottky diode contact can be formed between the epitaxial layer 12 and a circuit conductor 42 which might be necessary for diaphragm biasing in final device form. This diode isolates the integrated circuit components from the etching power supply during wafer fabrication yet effectively biases the diaphragm epitaxial region under normal circuit operation.

Figure 4:
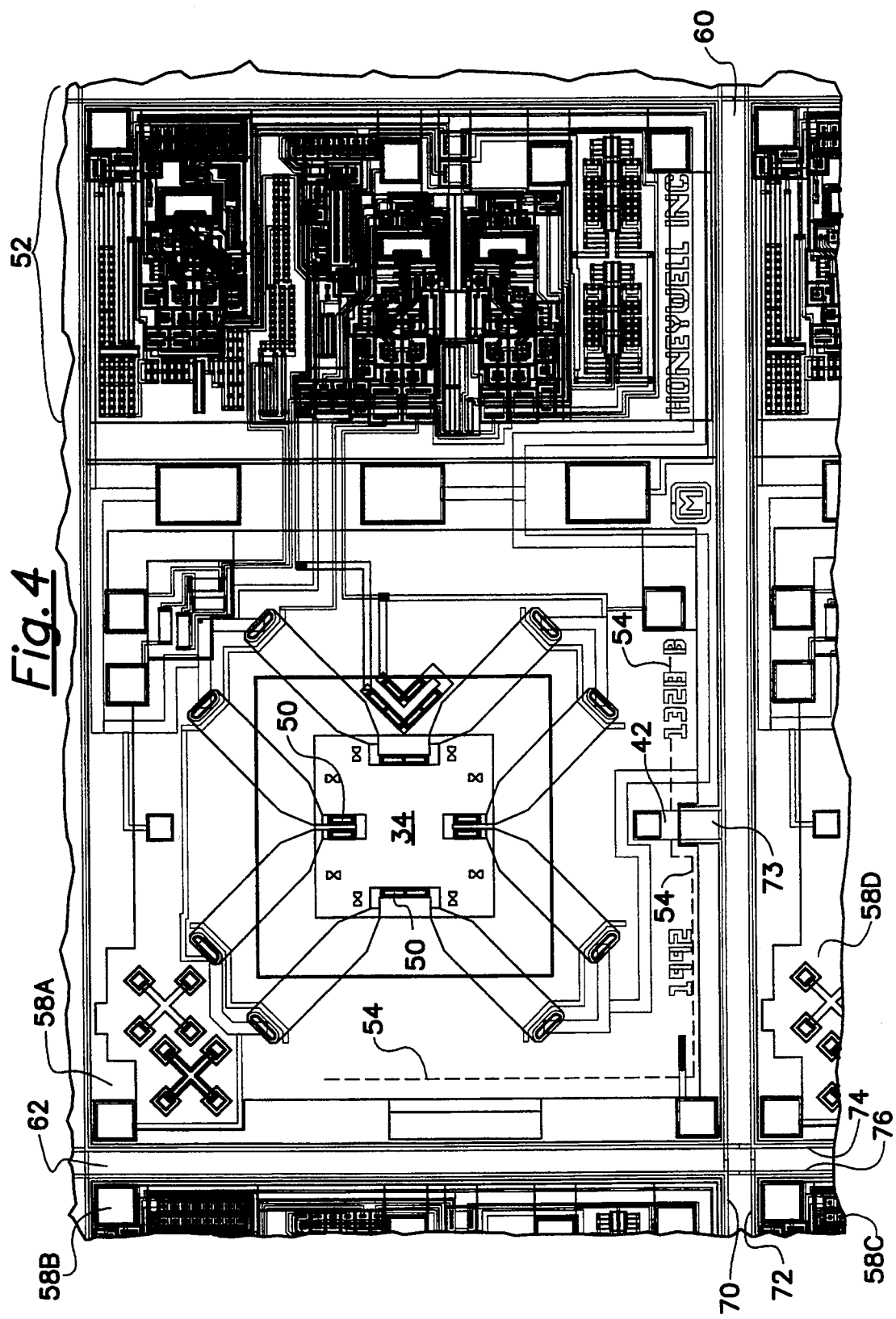
FIG. 4 illustrates a silicon die with partial views of three adjacent silicon dice made in accordance with the present invention.

FIG. 4 illustrates a die location on a silicon wafer. A diaphragm region 34 is provided with a preselected number of piezoresistive elements 50 which are used during the operation of the pressure transducer. Around the diaphragm region 34, an isolation diffusion of P+ type material is provided to isolate the diaphragm from the integrated circuit components located in a circuit portion 52 of the die. Although the P+ type isolation diffusion is not normally visible in a drawing of the type shown in FIG. 4, dashed line 54 illustrates a portion of the path along which the P+ type isolation diffusion is located. Although only a portion of the path is illustrated by dashed line 54, it should be understood that this diffusion layer extends completely around the diaphragm region 34 and isolates it from other portions of the die location. As can be seen by the portion of a silicon wafer illustrated in FIG. 4, each particular die location 58A is located proximate another die location 58B. In the illustration of FIG. 4, the die location 58A, which is shown completely, is located adjacent neighboring die locations 58B, 58C and 58D. The die locations are arranged in row and column configurations. In between each adjacent row, a row interstice 60 separates adjacent die location rows. In addition, inbetween adjacent columns, a column interstice 62 is located. These interstices divide the silicon wafer into the plurality of die locations and permit the plurality of die locations to be separated from each other by a subsequent sawing or dicing operation.

With continued reference to FIG. 4, it can be seen that two conductors, 70 and 72, are disposed in the row interstice 60 and two other conductors, 74 and 76, are disposed in the column interstice 62. The conductors in the row interstice and the conductors in the column interstice are connected to each other in electrical communication at the intersections where they cross each other. It should be understood that on the surface of a silicon wafer, many row interstice conductors cross many column interstice conductors to form a screen pattern with many electrical connections between individual conductors.

With continued reference to FIG. 4, a conductive extension 42 is connected in electrical communication with row interstice conductor 72 and with a portion of the upper surface of the die that is on an opposite side of the P+ type isolation diffusion, at dashed line 54, then the interstice 60. This permits a voltage potential on conductor 70 to be connected in electrical communication with the region of the first side of the silicon wafer that is within dashed line 54 and therefore on the same side of the P+ isolation diffusion as diaphragm region 34.

Figure 5:
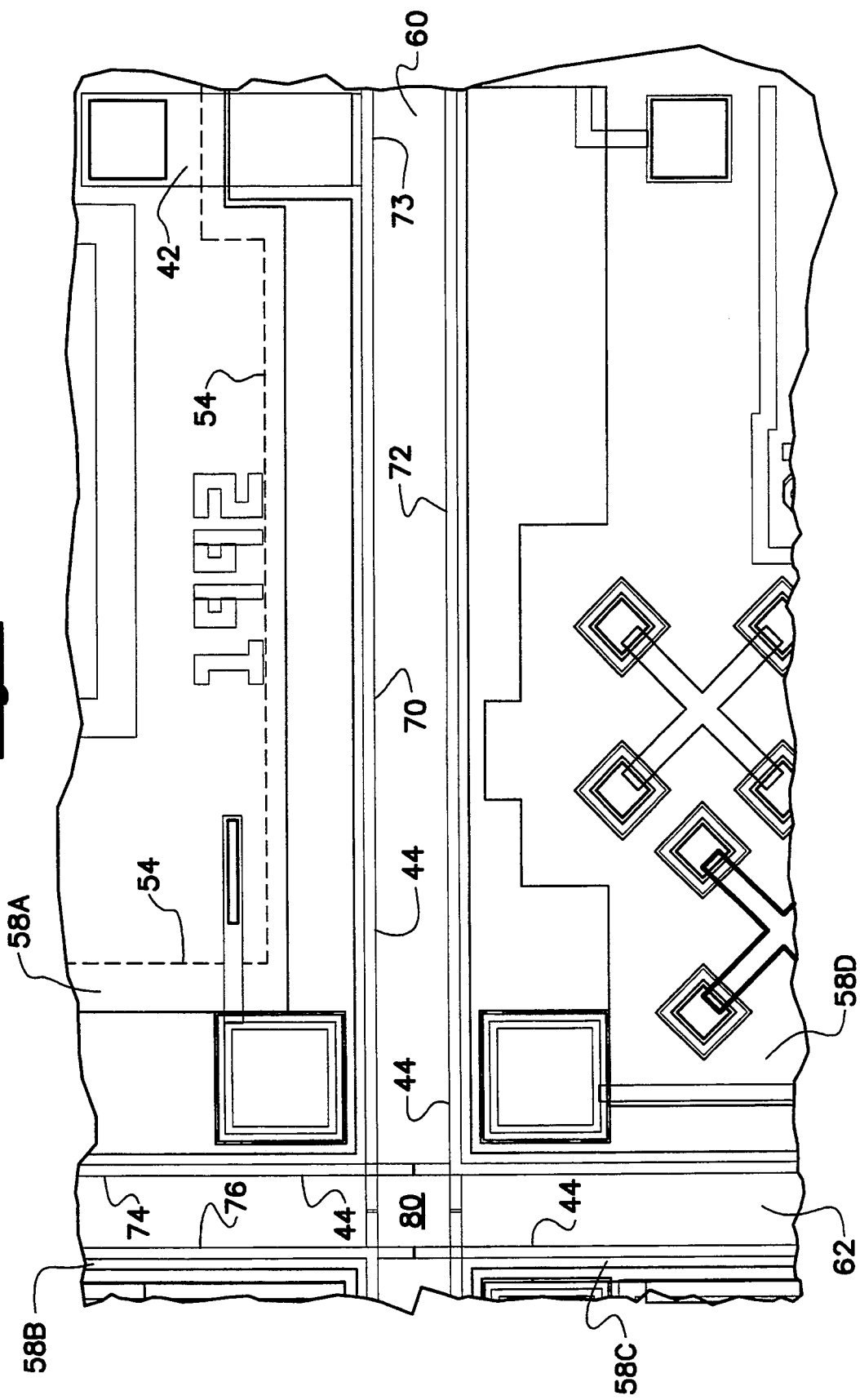
FIG. 5 shows an enlarged view of a portion of FIG. 4.

FIG. 5 is an enlarged view of a portion of FIG. 4 proximate the intersection 80 and the conductive extension 42. The conductive extension 42 can be seen bridging across the P+ type isolation diffusion region 54 and providing electrical communication between one of the conductors 44 and the region proximate the diaphragm region 34 of the pressure transducer. Although FIGS. 4 and 5 illustrate the conductive extension 42 being connected in electrical communication with row interstice conductor 70 at region 73, it should be understood that the basic principles of the present invention would equally serve their purposes if the conductive extension 42 was connected to one of the other conductors 44 such as conductors 72, 74 or 76.

FIG. 6 is an exemplary illustration of four die locations, 58E, 58F, 58G and 58H, on a silicon wafer. Although the diaphragm regions and integrated circuit regions of these four die locations in FIG. 6 are not illustrated, it should be understood that they exist, but have been omitted for purposes of clarity. Die location 58G, however, is intentionally filled with an electrical conductor, such as aluminum, over its entire area. The conductive material at die location 58G is connected physically with conductors 72 and 76 and in electrical communication with conductors 70 and 74. However, it should also be clearly understood that the electrically conductive material of die location 58G is also connected in electrical communication with all other conductors in all of the other interstices because of the interconnections that exist between all of the conductors at their respective common intersections.

Figure 7:
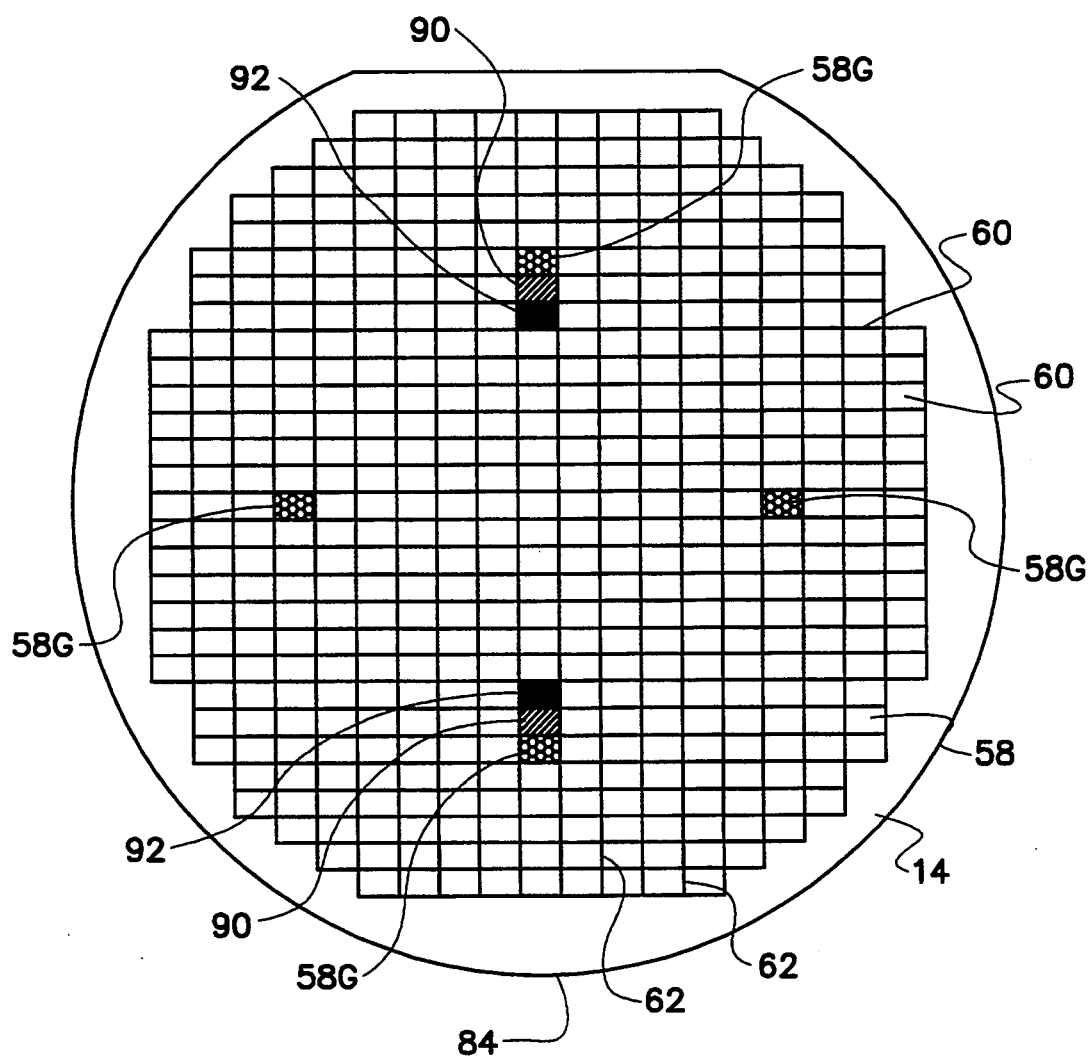
FIG. 7 shows a silicon wafer having a plurality of die locations arranged in rows and columns on the surface of a first side of a wafer.

FIG. 7 shows a schematic illustration of a silicon sensor wafer 84 which has a plurality of die locations arranged in rows and columns on a surface of its first side 14. Each die location 58 is separated from adjacent die locations by row interstices 60 and column interstices 62. As described above, these row and column interstices are subsequently used to permit the silicon wafer 84 to be sawed into individual dice. Four of the die locations are identified by reference number 58G to indicate that they are completely covered by an electrical conductor, such as aluminum. However, it should be understood that the number of these locations can be different and, furthermore, that the number is not directly related to the present invention. As described above in conjunction with FIG. 6, the covered die locations 58G are connected in electrical communication with all other conductors that are disposed in the row interstices and column interstices. In this particular embodiment of the present invention, the four die locations 58G are completely covered with a conductor and spaced apart from each other on the first side of the wafer 84 to permit four electrical contacts to be disposed in electrical communication with them. The die locations identified by referenced numeral 90 are used for the purpose of specific test structures and the die locations identified by reference numeral 92 serve the purpose of process monitoring. These techniques are very well known by those skilled in the art of silicon processing.

Although many different types of fixtures can be used in conjunction with the method of the present invention to manufacture an apparatus within the scope of the present invention, FIG. 8 shows a schematic illustration of one means for providing the necessary electrical contact with the die locations 58G that are completely covered by an electrically conductive material, such as aluminum. A fixture can be provided which disposes a compressible component, such as a spring 98, in electrical communication with a region of the first side 14 of the silicon wafer 84 at which a die location 58G is located. This contact places the spring 98 in electrical communication with the conductor that is disposed on the die location 58G. The spring 98 is connected in electrical communication with a conductive plate 100 which, in turn, is connected in electrical communication with a power supply to raise the voltage potential of the spring 98 to the supply voltage $V_S$. In one particular fixture used in conjunction with the present invention, the conductive plate 100 is disposed on a first side of a staging plate 102 which is used to carefully position the spring on die 58G. This places sufficient force on the spring 98 to assure good electrical contact between a power supply and the die locations 58G which are covered by an electrically conductive material. The voltage potential from the power supply is transferred to the conductive plate 100 and to the spring 98. The force of the spring against die locations 58G provides electrical communication between the power supply and the electrically conductive material of die locations 58G. The physical and electrical connection between die locations 58G and the conductors in the row and column interstices provides electrical voltage potential at all of those conductors within all the interstices on the first side of the silicon wafer. The electrical connection between the conductive extensions 42 and the conductors 44 provides a voltage potential at the opposite ends of the conductive extensions which are on the same side of the isolation diffusions as the diaphragm regions 34. Therefore, reliable electrical connection is provided between the power supply and the diaphragm region 34 of each and every die location. This permits the etching procedure to be performed properly and avoids the problems described in detail above.

Although the present invention has been illustrated with particular specificity and described to illustrate a particularly preferred embodiment of the present invention, it should be understood that alternative embodiments are also within its scope.

The embodiments of the invention in which an exclusive property or right is claimed are defined as follows:

1. A method of making a micromachined semiconductor component, comprising:
   providing a wafer of semiconductive material having a first side and a second side;
   defining a plurality of die locations on said first surface of said wafer, said plurality of die locations being arranged in a pattern of rows and columns, each of said rows being separated from an adjacent one of said rows by a row interstice and each of said columns being separated from an adjacent one of said columns by a column interstice;
   disposing a plurality of conductors on said first surface, at least one of a first group of said plurality of conductors being disposed in said row interstice, at least one of a second group of said plurality of conductors being disposed in said column interstice;
   disposing a plurality of conductive extensions on said first surface, each of said plurality of conductive extensions being disposed in electrical communication with a preselected one of said conductors and in electrical communication with a region of one of said plurality of die locations;
   connecting one of said plurality of conductors in electrical communication with a voltage potential; and
   disposing an etchant in contact with preselected locations on said second side of said wafer.

2. The method of claim 1, further comprising:
   physically separating each one of said plurality of die locations from the other ones of said plurality of die locations.

3. The method of claim 2, wherein:
   said separating step comprises the step of sawing said wafer along said row and column interstices.

4. The method of claim 1, wherein:
   each of said plurality of conductive extensions extends across a positively doped region of an associated one of said plurality of die locations.

5. The method of claim 1, wherein:
   each of said plurality of conductors is aluminum.

6. The method of claim 1, wherein:
   each of said plurality of conductive extensions is aluminum.

7. The method of claim 1, wherein:
   two of said first group of said plurality of conductors are disposed in said row interstice and two of said second group of said plurality of conductors are disposed in said column interstice.

8. The method of claim 1, wherein:
   said electrical communication between each of said plurality of conductive extensions and said region of one of said plurality of die locations is a Schottky diode contact.

9. A method of making a micromachined semiconductor component, comprising:
   providing a silicon wafer having a first side and a second side;
   defining a plurality of die locations on said first surface of said wafer, said plurality of die locations being aligned in a pattern of rows and columns, each of said rows being separated from an adjacent one of said rows by a row interstice and each of said columns being separated from an adjacent one of said columns by a column interstice;
   disposing a plurality of electrical conductors on said first surface, at least one of said plurality of electrical conductors being disposed in said row interstice, at least one of said plurality of electrical conductors being disposed in said column interstice;
   disposing a plurality of electrically conductive extensions on said first surface, each of said plurality of conductive extensions being disposed in electrical communication with a preselected one of said conductors and in electrical communication with a region of at least one of said plurality of die locations;

connecting one of said plurality of conductors in electrical communication with a voltage potential;

disposing an etchant in contact with preselected locations on said second side of said wafer; and raising the voltage potential of said plurality of conductors to a magnitude which is higher that the voltage potential of said second side.

10. The method of claim 9, further comprising:

physically separating each one of said plurality of die locations from the other ones of said plurality of die locations.

11. The method of claim 10, wherein:

said separating step comprises the step of sawing said wafer along said row and column interstices.

12. The method of claim 9, wherein:

each of said plurality of conductive extensions extends across a positively doped region of an associated one of said plurality of die locations.

13. The method of claim 9, wherein:

each of said plurality of electrical conductors is aluminum.

14. The method of claim 9, wherein:

each of said plurality of conductive extensions is aluminum.

15. The method of claim 9, wherein:

two of said plurality of conductors are disposed in said row interstice and two of said plurality of conductors are disposed in said column interstice.

16. The method of claim 9, wherein:

said electrical communication between each of said plurality of conductive extensions and said region of at least one said plurality of die locations is a Schottkey diode contact.

17. A method of making a micromachined semiconductor component, comprising:

providing a silicon wafer having a first side and a second side;

defining a plurality of die locations on said first surface of said wafer, said plurality of die locations being aligned in a plurality of rows and a plurality of columns, each of said plurality of rows being separated from an adjacent one of said plurality of rows by a row interstice and each of said plurality of columns being separated from an adjacent one of said plurality of columns by a column interstice;

disposing a plurality of electrical conductors on said first surface, at least one of said plurality of electrical conductors being disposed in said row interstice, at least one of said plurality of electrical conductors being disposed in said column interstice;

disposing a plurality of electrically conductive extensions on said first surface, each of said plurality of conductive extensions being disposed in electrical communication with a preselected one of said conductors and in electrical communication with a region of at least one of said plurality of die locations;

connecting one of said plurality of conductors in electrical communication with a voltage potential;

disposing an etchant in contact with preselected locations on said second side of said wafer;

raising the voltage potential of said plurality of conductors to a magnitude which is higher that the voltage potential of said second side; and physically separating each one of said plurality of die locations from the other ones of said plurality of die locations.

18. The method of claim 17, wherein:

said electrical communication between each of said plurality of conductive extensions and said region of at least one of said plurality of die locations is a Schottky diode contact.

* * * * *